(12) United States Patent
Wu et al.

(10) Patent No.: US 10,670,654 B2
(45) Date of Patent: Jun. 2, 2020

(54) PROBE CARD AND WAFER TESTING SYSTEM AND WAFER TESTING METHOD

(71) Applicant: TAIWAN SEMICONDUCTOR MANUFACTURING CO., LTD., Hsinchu (TW)

(72) Inventors: Yuan-Chun Wu, Shanghai (CN); Chang-Chun Xu, Shanghai (CN); Ni Shen, Shanghai (CN)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/058,071

(22) Filed: Mar. 1, 2016

(65) Prior Publication Data

US 2017/0184663 A1    Jun. 29, 2017

(30) Foreign Application Priority Data

Dec. 24, 2015    (CN) .......................... 2015 1 0982543

(51) Int. Cl.
*G01R 31/28* (2006.01)
*G01R 1/073* (2006.01)
*H01L 21/66* (2006.01)

(52) U.S. Cl.
CPC ...... *G01R 31/2891* (2013.01); *G01R 31/2831* (2013.01); *G01R 31/2884* (2013.01); *H01L 22/34* (2013.01)

(58) Field of Classification Search
CPC ................ G01R 31/28; G01R 31/2851; G01R 31/2886–2891; G01R 1/02; G01R 1/06–06794; G01R 1/073–07392
See application file for complete search history.

(56) References Cited

U.S. PATENT DOCUMENTS

| | | | | |
|---|---|---|---|---|
| 4,757,256 A | * | 7/1988 | Whann | G01R 1/07342 324/750.25 |
| 5,521,518 A | * | 5/1996 | Higgins | G01R 1/07342 324/750.23 |
| 5,729,149 A | * | 3/1998 | Bradshaw | G01R 31/2887 324/750.25 |
| 6,037,785 A | * | 3/2000 | Higgins | G01R 1/07342 324/754.13 |
| 6,262,586 B1 | * | 7/2001 | Furasawa | G01R 1/06705 324/750.24 |

(Continued)

FOREIGN PATENT DOCUMENTS

| | | |
|---|---|---|
| CN | 1779469 A | 5/2006 |
| CN | 102384992 A | 3/2012 |

(Continued)

*Primary Examiner* — Huy Q Phan
*Assistant Examiner* — David B Frederiksen
(74) *Attorney, Agent, or Firm* — Maschoff Brennan (57) ABSTRACT

A probe card, a wafer testing system and a wafer testing method are provided. The wafer testing system includes a wafer holder and a probe card. A wafer is held on the wafer holder, and testing pads are formed on the wafer, in which the testing pads are arranged along a test straight line. The probe card includes probes each of which includes an arm portion and a tip portion. An included angle between the test straight line and an extension of a projection line of the arm portion onto the wafer ranges from about 40 degrees to about 55 degrees.

20 Claims, 9 Drawing Sheets

(56) References Cited

U.S. PATENT DOCUMENTS

| | | | |
|---|---|---|---|
| 6,864,697 B1 | 3/2005 | Lin | |
| 7,471,094 B2 * | 12/2008 | Hobbs | G01R 31/2886 |
| | | | 324/750.22 |
| 7,595,651 B2 | 9/2009 | Ku et al. | |
| 7,692,433 B2 * | 4/2010 | Eldridge | G01R 1/07342 |
| | | | 324/754.07 |
| 8,427,186 B2 | 4/2013 | McFarland | |
| 8,446,160 B2 * | 5/2013 | Gunji | G01R 3/00 |
| | | | 324/750.01 |
| 9,372,205 B2 | 6/2016 | Hsu | |
| 2003/0102878 A1 * | 6/2003 | Montoya | G01R 1/07314 |
| | | | 324/754.14 |
| 2004/0119463 A1 * | 6/2004 | Lou | G01R 1/07342 |
| | | | 324/750.08 |
| 2004/0124519 A1 * | 7/2004 | Zhou | G01R 1/07378 |
| | | | 257/686 |
| 2005/0035778 A1 * | 2/2005 | Lin | G01R 31/2887 |
| | | | 324/750.25 |
| 2006/0109014 A1 * | 5/2006 | Chao | G01R 31/2884 |
| | | | 324/756.03 |
| 2006/0170438 A1 * | 8/2006 | Park | G01R 1/07342 |
| | | | 324/754.07 |
| 2008/0007278 A1 * | 1/2008 | Ku | G01R 31/2889 |
| | | | 324/756.03 |
| 2008/0191726 A1 * | 8/2008 | Ku | G01R 1/07342 |
| | | | 324/755.07 |
| 2010/0176396 A1 * | 7/2010 | Wada | G01R 1/06733 |
| | | | 257/48 |
| 2010/0327897 A1 * | 12/2010 | Kazama | G01R 1/07378 |
| | | | 324/756.03 |
| 2011/0169516 A1 * | 7/2011 | McFarland | G01R 1/06722 |
| | | | 324/755.05 |
| 2012/0017428 A1 | 1/2012 | Hsu et al. | |
| 2012/0032697 A1 * | 2/2012 | Khoo | G01R 1/06727 |
| | | | 324/755.07 |
| 2012/0086466 A1 | 4/2012 | Chou | |
| 2013/0021053 A1 * | 1/2013 | Ku | G01R 1/073 |
| | | | 324/756.03 |
| 2013/0169300 A1 | 7/2013 | Ishikawa et al. | |
| 2014/0266280 A1 * | 9/2014 | Yeh | G01R 3/00 |
| | | | 324/755.11 |

FOREIGN PATENT DOCUMENTS

| | | |
|---|---|---|
| CN | 103187333 A | 7/2013 |
| CN | 103675368 A | 3/2014 |
| JP | H10-223705 A | 8/1998 |
| JP | 2008098534 A | 4/2008 |
| TW | M431327 U | 6/2012 |
| TW | M472305 U | 2/2014 |
| TW | 201531714 A | 8/2015 |

* cited by examiner

PROBE CARD AND WAFER TESTING SYSTEM AND WAFER TESTING METHOD

RELATED APPLICATIONS

This application claims priority to Chinese Application Serial Number 201510982543.2, filed Dec. 24, 2015, which is herein incorporated by reference.

BACKGROUND

A wafer acceptable test (WAT) refers to using probes to feed testing signals into a testing structure of a wafer, and then using a feedback signal analysis to understand electrical properties of the wafer, thereby determining if the wafer has defects appearing during fabrication. In the WAT, a probe card is used to simultaneously test plural chips on the wafer. The probe card includes plural probes corresponding to plural testing pads on the wafer, in which the testing pads are connected to plural devices under test (DUTs) on the wafer. With the increasing chip integrity, contact areas between the tips of the probes and the testing pads are greatly shrunk, the affecting the WAT results.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first", "second", etc., may be used in the claims to describe various elements, these elements should not be limited by these terms, and these elements correspondingly described in the embodiments are presented by different reference numbers. These terms are used to distinguish one element from another. For example, a first element could be termed a second element, and, similarly, a second element could be termed a first element, without departing from the scope of the embodiments. Further, when a first element is described as being "connected" to a second element, such description includes embodiments in which the first and second elements are directly connected or coupled to each other, and also includes embodiments in which the first and second elements are indirectly connected or coupled to each other with one or more other intervening elements in between.

In general, for performing a subsequent dicing operation, a scribe lane is formed in two adjacent chips, and testing pads connected to devices under test on a wafer are generally formed in the scribe lane, so as to avoid occupying available surface areas of the wafer. When tips of probes contact the testing pads, the tests pads exert a normal force on the probes, thus deforming the probes and causing the tips of the probes to slide laterally. Such sliding often causes the tips of the probes to slide out of the scribe lane and the testing pads. In addition, the tips of the probes are formed from a hard electrically conductive material such as titanium nitride, rhodium, tungsten, nickel, etc. When the tips of the probes contact the testing pads, electrically conductive particles often escape therefrom and fall on the testing pads. At this moment, the sliding of the tips of the probes may bring the electrically conductive particles to an area between two metal wires adjacent to the scribe lane or the testing pads, thus shorting the metal lines. The aforementioned problems regarding the tips of the probes escaping the scribe lane and the testing pads and/or the metal lines shorted by the electrically conductive particles will result in the WAT failure.

In order to prevent the tips of the probes from escaping the scribe lane and the testing pads, widths of the scribe lane and the testing pads have to be maintained above certain values. However, each wafer has already had quite a few scribe lanes, and each of the scribe lanes occupies a certain wafer surface area on which no electrical elements are allowed to be disposed, and thus it is difficult to increase the widths of the scribe lanes and the testing pads. Embodiments of the present disclosure are directed to deviating a horizontal angle of the probes entering the testing pads by a proper value, such as about 45 degrees, thereby allowing the tips of the probes to have longer slidable distances on the respective test pads when contacting the testing pads, such that the widths of the scribe lanes and the testing pads do not need to be increased and even can be decreased. The slidable distances refer to the distances within which the tips of the probes would not slide out of the testing pads. Further, the longer slidable distances also may lower the possibility of bringing the electrically conductive particles to the area between two metal wires. Thus, embodiments of the present disclosure area able to promote the success rate of the WAT.

Figure 1A:
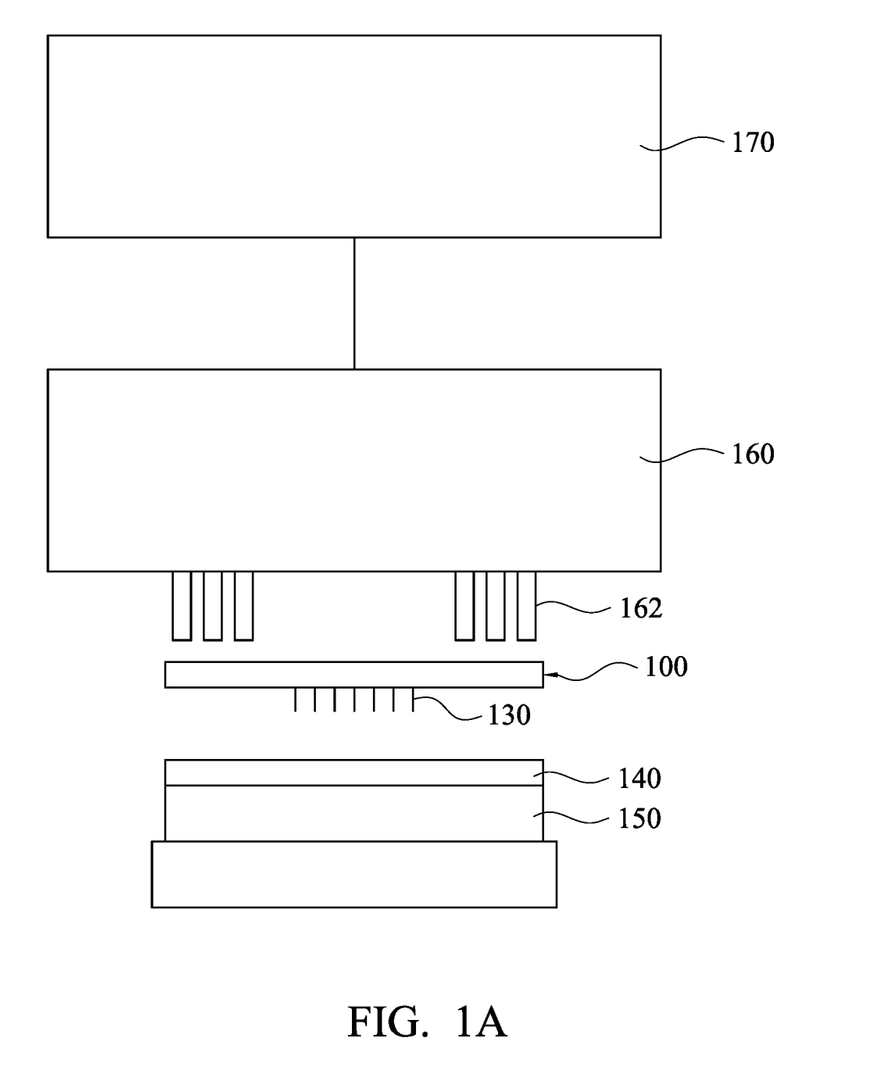
FIG. 1A and FIG. 1B schematic diagrams showing a wafer testing system in accordance with some embodiments of the present disclosure.
Figure 1B:
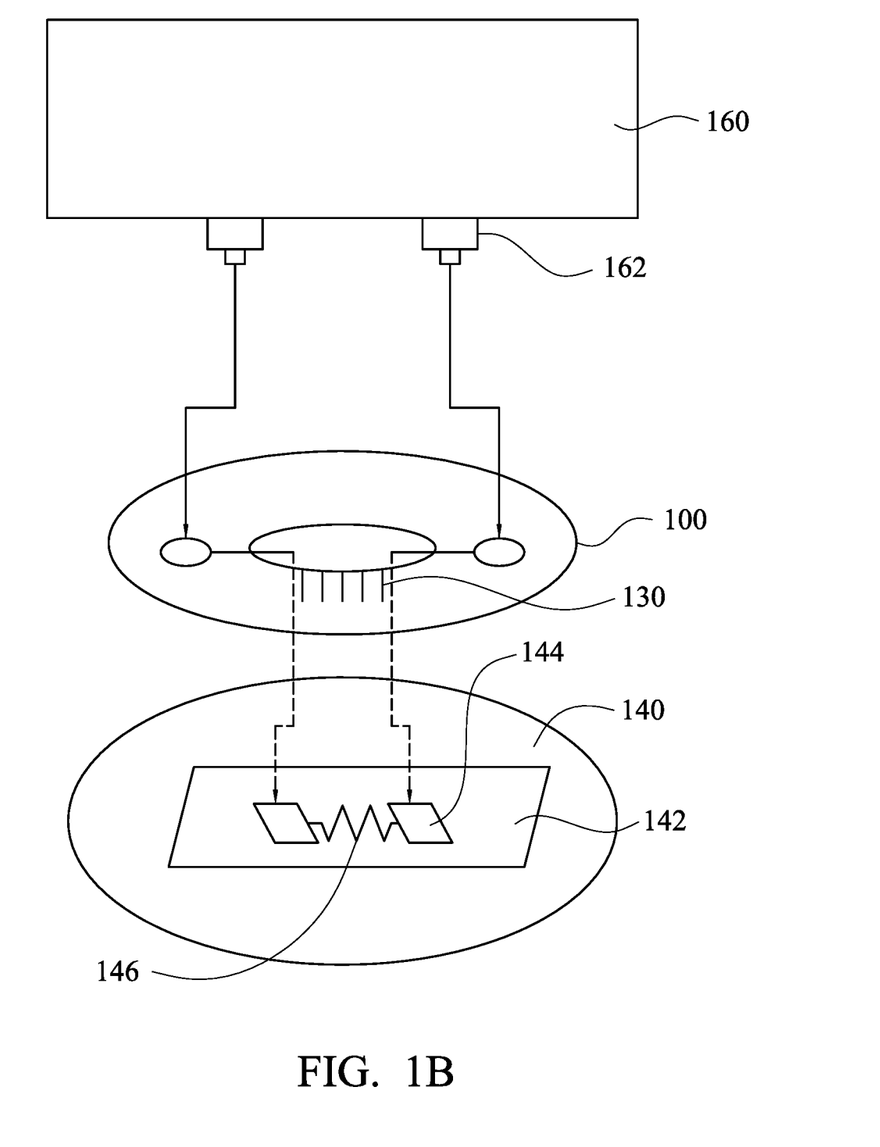

Referring to FIG. 1A and FIG. 1B, FIG. 1A and FIG. 1B schematic diagrams showing a wafer testing system in accordance with some embodiments of the present disclosure. The wafer testing system includes a probe card 100, a wafer holder 150, a test head 160 and a tester 170. The probe card 100 includes probes 130, and is disposed below the test head 160 by connecting to pins 162. The pins 162 may be pogo pins, for example. The tester 170 is coupled to the test head 160, in which program are stored in the tester 170 for testing various integrated circuit (IC) designs. The probe card 100 is an interface disposed between the test head 160 and a DUT (Device Under Test) 146. The probe card 100 is able to convert a fixed pin-out capability. For example, the probe card 100 may convert input or output channels having hardware wirings in the tester 170 to a pin arrangement with flexibility, thereby providing a design matching with a specific IC design. Thus, the tester 170 may use the same one test head 160 which is generally very expensive to test various designs.

A wafer 140 is mounted on the wafer holder 150 for being ready to receive tests, in which testing pads 144 are disposed on a scribe lane 142, as shown in FIG. 1B. The testing pads 144 are arranged along a test straight line and electrically connected to the DUT 146. In some embodiments, plural devices under test (DUTs) 146 and plural scribe lanes 142 are formed on the wafer 140, in which the devices under test (DUT) 146 are disposed on the scribe lanes 142. Then, plural elongated testing pads 144 arranged along a straight line are disposed on at least one of the scribe lanes. Thereafter, plural probes 130 are disposed with their tips arranged along a straight line, and the tips of the probes are used to contact the respective testing pads 144 for performing an electrical property measurement on the wafer 140.

When the wafer test is performed, the probes 130 of the probe card 100 are first aligned with the testing pads 144 on the wafer 140 respectively, and then the probe card 100 is vertically descended or the wafer holder 150 is vertically ascended until the probes 130 contact the testing pads 144. Meanwhile, the probe card 100 transmits input signals to the DUTs 146 and then receives output signals outputted from the DUTs 146, in which the output signals are in response to the input signals, and the input signals inputted to the probe card 100 and the DUTs 146 are generated by the tester 170. Thereafter, the test head 160 transmits the output signals to the tester 170, and the tester analyzes the output signals to determine the electrical properties of the DUTs 146.

Figure 2A:
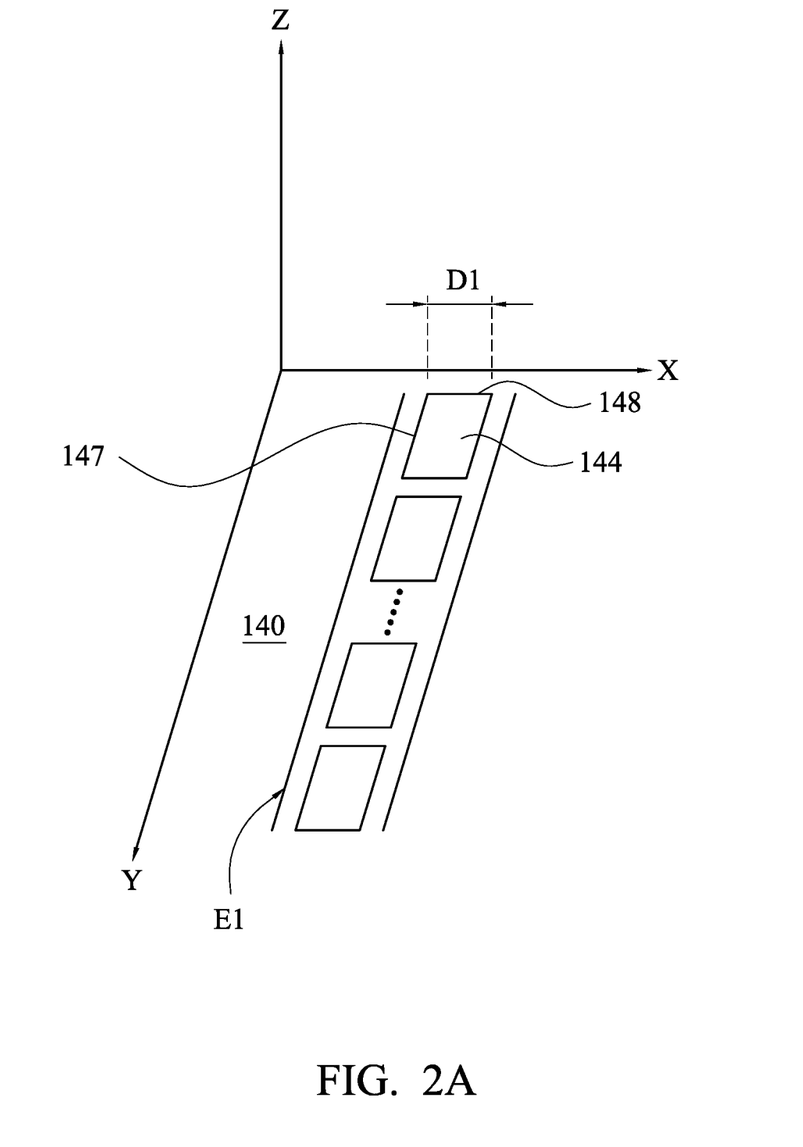
FIG. 2A is a schematic diagram showing an arrangement of testing pads in accordance with some embodiments of the present disclosure.

Referring to FIG. 2A, FIG. 2A is a schematic diagram showing an arrangement of the testing pads 144 in accordance with some embodiments of the present disclosure, in which the testing pads 144 are arranged along a test straight line E1 (for example, a Y axis). Each of the testing pads 144 has a first side 147 and a second side 148 adjacent to the first side 147, in which the first side 147 is about parallel to the test straight line E1, and a width (the second side 148) of the testing pad 144 is smaller than a width of the scribe lane 142.

Figure 2B:
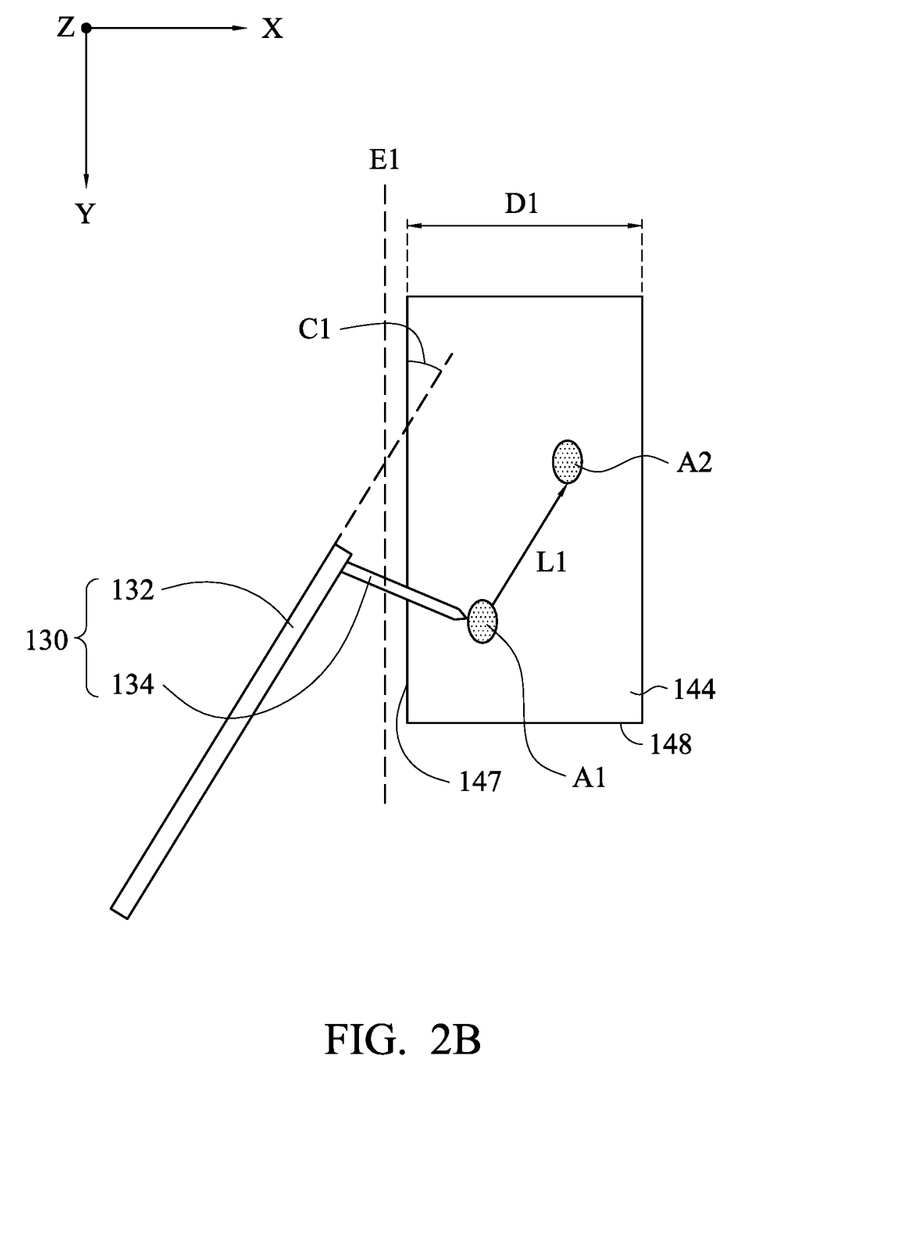
FIG. 2B is a schematic diagram showing a positional relationship between probes and the testing pads in accordance with some embodiments of the present disclosure.

Referring to FIG. 2A and FIG. 2B, FIG. 2B is a schematic diagram showing a positional relationship between the probes 130 and the testing pads 144 in accordance with some embodiments of the present disclosure. As shown in FIG. 2B, each probe 130 includes an arm portion 132 and a tip portion 134 connected to the arm portion 132, wherein the tip portion 134 is configured to contact the testing pad 144 on the wafer 140. The tip portion 134 of the probe 130 is formed from a hard electrically conductive material such as titanium nitride, rhodium, tungsten, nickel, etc. When contacting and sliding on the testing pad 144, the tip portion 134 of the probe 130 generates a scratching effect onto a surface of the testing pad 144 to remove an oxidized layer on the testing pad 144 due to being exposed to air, thereby lowering a contact resistance between the testing pad 144 and the probe 130 to testing signal distortion.

When the probes 130 of the probe card 100 are aligned with the testing pads 144 on the wafer 140 respectively, an included angle C1 is formed between the test straight line E1 and an extension of a projection line of the arm portion 132 of each probe 130 projected onto the corresponding testing pad 144, and the included angle C1 ranges from about 40 degrees to about 55 degrees. When contacting the testing pad 144, the tip portion 134 of the probe 130 would slide from a contact point A1 to another contact portion A2 along a direction L1 parallel to the arm portion 132. Thus, when the included angle C1 is 45 degrees, the longest slidable distance of the tip portion 134 sliding on the testing pad 144 is $\sqrt{2} \times D1$ (D1 is the length of the second side 148). The longest slidable distance herein is referred to as a "sliding process window", meaning that the tip portion 134 of the probe 130 may slide within the sliding process window without escaping the testing pad 144. It is known that an arm portion of a conventional probe enters the testing pad 144 along a direction vertical to the first arm 147, and thus the longest slidable of a tip portion of the conventional probe on the testing pad 144 is D1. Therefore, compared with the conventional probe, the probe 130 in the embodiments of the present disclosure has a larger "sliding process window"(a longer slidable distance), for example, $\sqrt{2} \times D1 > D1$, thereby effectively preventing the tip portion 134 of the probe 130 from escaping the testing pad 144, and lowering the possibility of bringing the electrically conductive particles to the area between two metal wires, thus promoting the success rate of the WAT. In other words, embodiments of the present disclosure deviate the sliding direction of the tip portion 134 of the probe 130 from the longer side of the testing pad 144 at the included angle C1 ranging from about 40 degrees to about 55 degrees, thereby allowing the tip portion 134 to have a relatively large "sliding process window" (slidable distance) on the testing pad 144, thus preventing the tip of the probe from escaping the scribe lane or the testing pad due to laterally sliding, further shrinking the widths of the scribe lane and the testing pad, and increasing wafer surface availability.

Figure 3A:
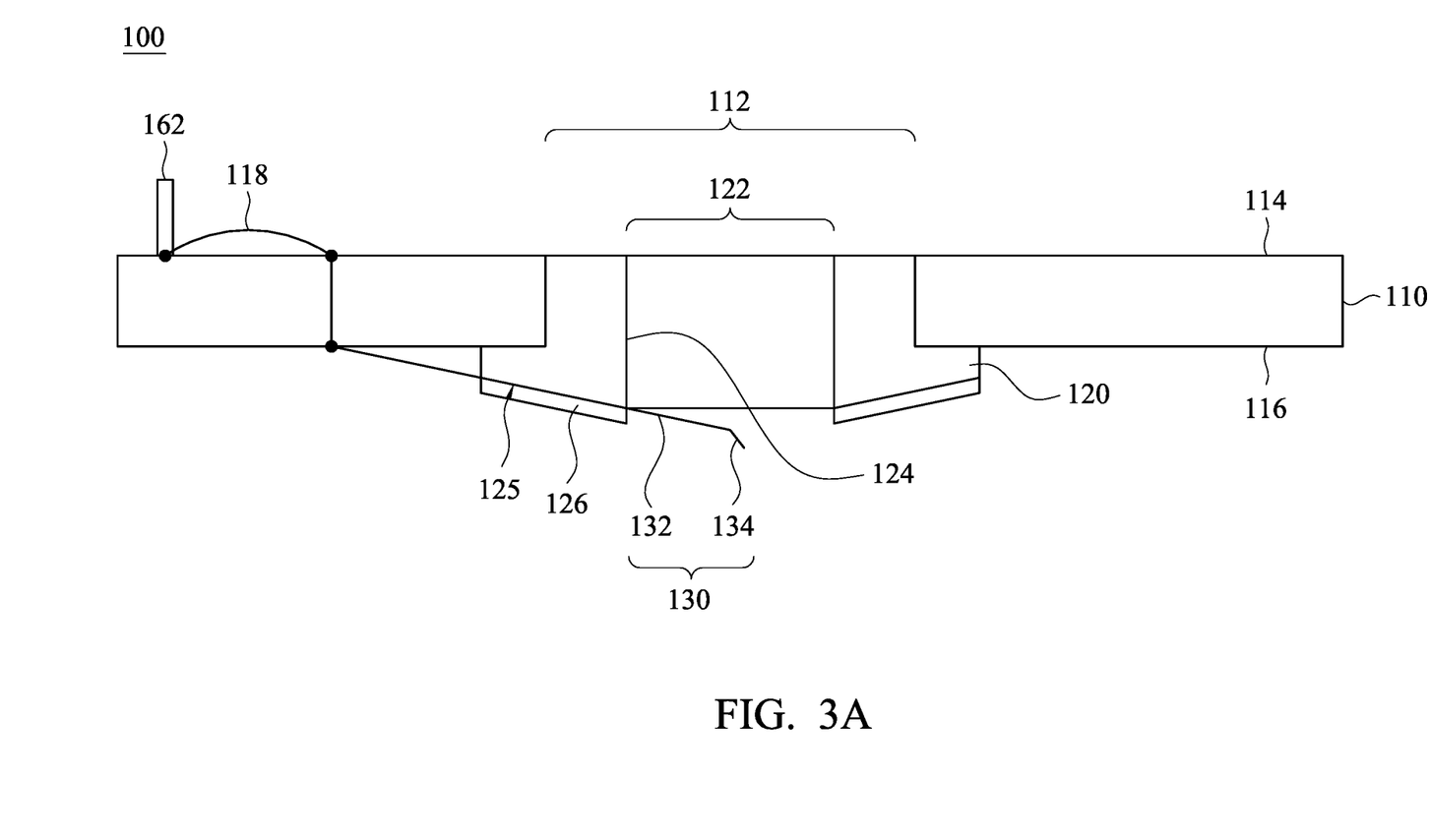
FIG. 3A is a schematic cross-sectional view of a probe card in accordance with some embodiments of the present disclosure.
Figure 3B:
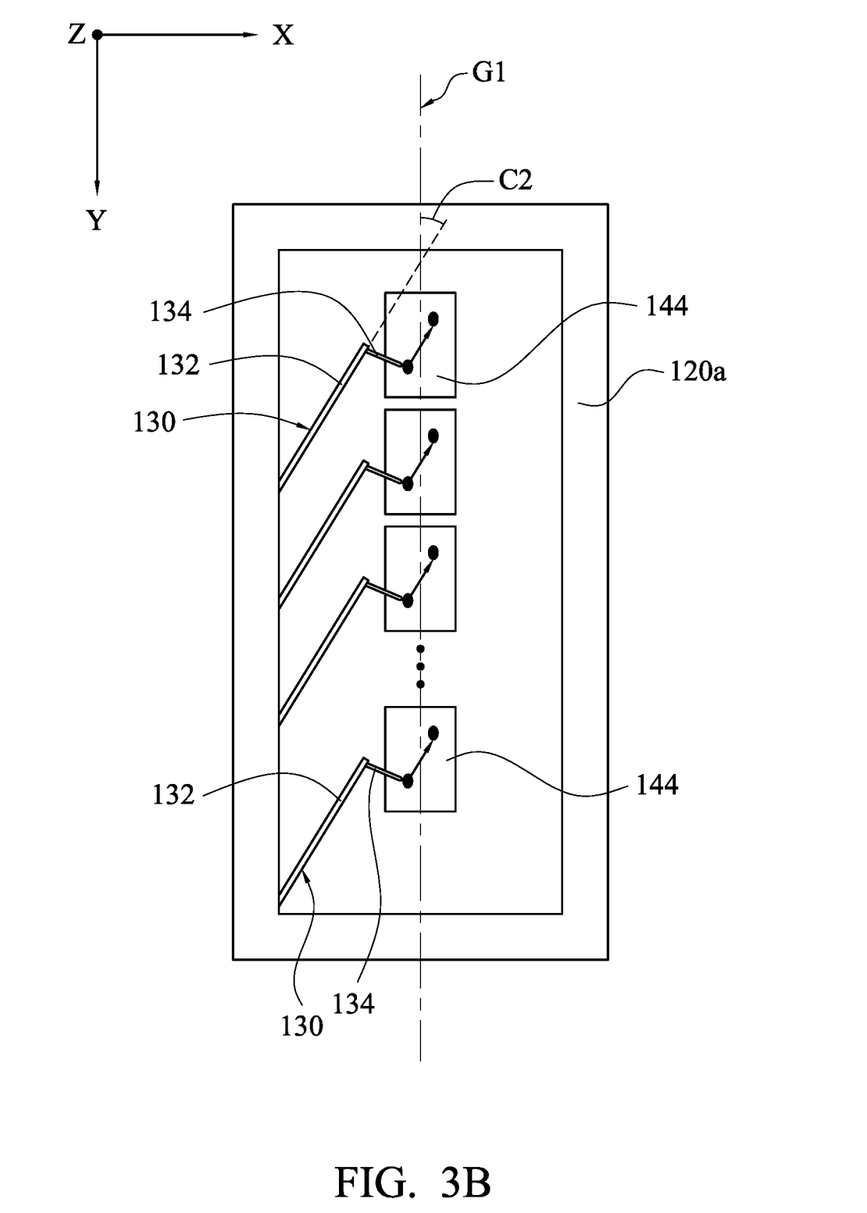
FIG. 3B is a schematic top view of a fixing member and the probes in accordance with some embodiments of the present disclosure.
Figure 3C:
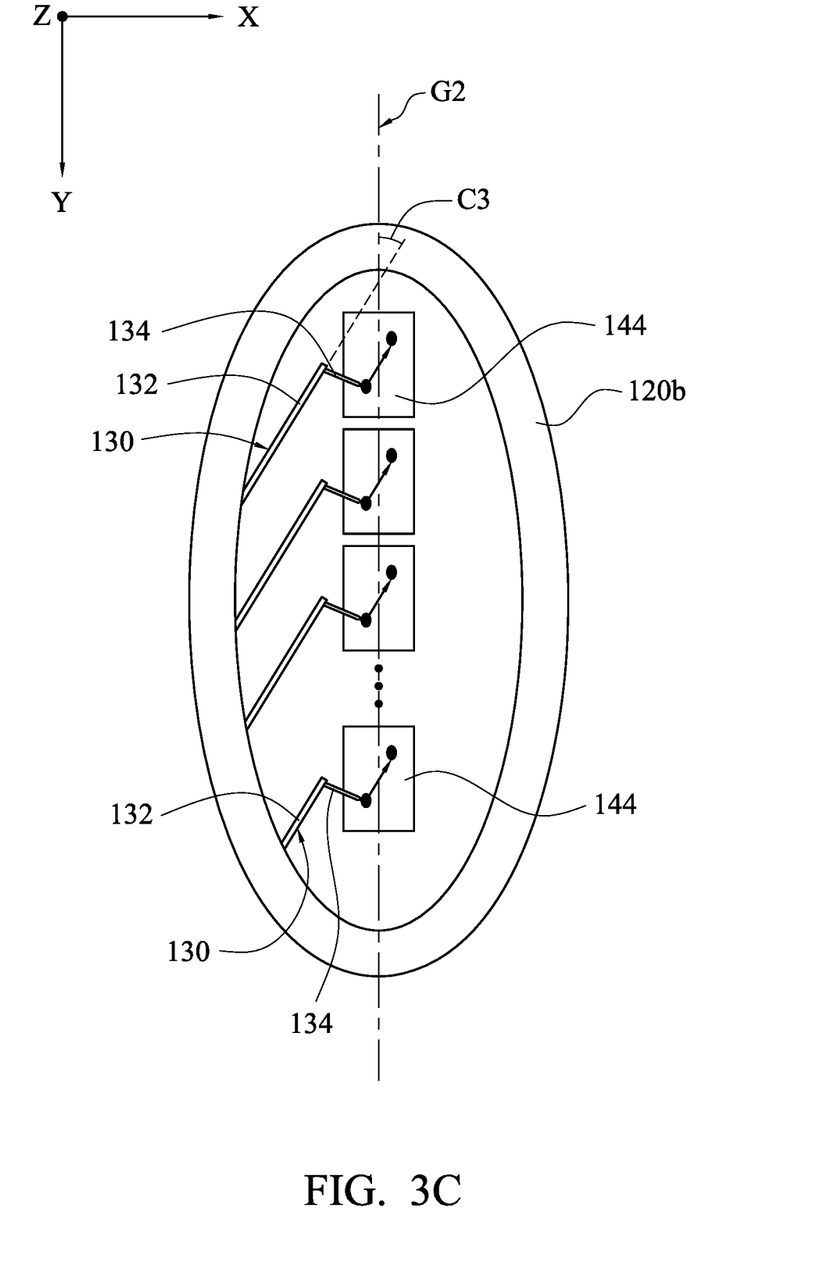
FIG. 3C is a schematic top view of another fixing member and the probes in accordance with certain embodiments of the present disclosure.

Referring to FIG. 3A, FIG. 3B and FIG. 3C, FIG. 3A is a schematic cross-sectional view of the probe card 100 in accordance with some embodiments of the present disclosure; FIG. 3B and FIG. 3C are schematic top views showing the fixing member 120 and the probes 130 in accordance with some embodiments of the present disclosure; and FIG. 3C is a schematic top view of another fixing member and the probes in accordance with certain embodiments of the present disclosure. As shown in FIG. 3A, the probe card 100 includes a circuit board 110, a fixing member 120, and the probes 130. The circuit board 110 has a first through opening 112, a first surface 114 and a second surface 116 opposite to the first surface 114. The fixing member 120 has a second through opening 122, in which the fixing member 120 passes through the first through opening 112 of the circuit board 110, and is fixed on the second surface 116 of the circuit board 110. The second through opening 122 has a vertical central line vertical to a direction parallel to the second surface 116, such as a vertical central line G1 shown in FIG. 3B, or a vertical central line G2 shown in FIG. 3C. When the probes 130 are aligned with the testing pads 144 respectively, the vertical central lines G1 and G2 are parallel to the test straight line E1 as shown in FIG. 2A and FIG. 2B along which the testing pads are arranged. In some embodiments, the fixing member 120 has plural grooves 125 extending from edges of the fixing member 120 to the second through opening 122. The arm portions 132 of the probes 130 are disposed in the grooves 125, and then are sealed by a sealing glue 126. The arm portions 132 of the probes 130 may also be disposed in the fixing member 120 by other methods, and thus embodiments of the present disclosure are not limited thereto. The test head is electrically connected to the probe 130 through the pin 162 and a jump wire 118 for inputting signals to the probe 130 or obtaining signals from the probe 130.

The circuit board 110 of the embodiments of the present disclosure may be a printed circuit board (PCB). Because the probe card 100 is used under a high-speed test condition, the material used for forming the circuit board 110 is quite critical. In some embodiments, a low dielectric constant material is used for fabricating the circuit board 110. The material for forming the circuit board 110 may include an glass reinforced epoxy laminate (such as G10/F4 with a dielectric constant of 4.8), a polimid material (with a dielectric constant of 4.2), polycrystalline $BaTiO_3$ (with a dielectric constant of 3.3-3.9), and an epoxy glass material (with a dielectric constant of about 3.38, for example).

Each probe 130 includes the arm portion 132 and the tip portion 134 connected to the arm portion 132. One end of the arm portion 132 is fixed on the second surface 116 of the circuit board 110, and the other end of the arm portion 132 passes through a portion of the fixing member 120 and is exposed from the second through opening 122. As shown in FIG. 3B and FIG. 3C, an includes angle C2 or C3 between the vertical central line G1 or G2 and an extension of the arm portion 132 ranges from about 40 degrees to about 55 degrees, in which the includes angle C2 or C3 is equal to the included angle C1 shown in FIG. 2B. In some embodiments, the second through opening 122 is rectangular (as shown in FIG. 3B), i.e. the second through opening 122 may be a rectangular ring. In certain embodiments, the second through opening 122 is elliptic (as shown in FIG. 3C), i.e. the second through opening 122 may be an elliptic ring. However, the second through opening 122 of the fixing member 120 may also be in another shape, as long as the included angle between the extension of the arm portion 132 and the vertical central line ranges between about 40 degrees and 55 degrees. Therefore, embodiments of the present disclosure are not limited thereto.

Figure 4:
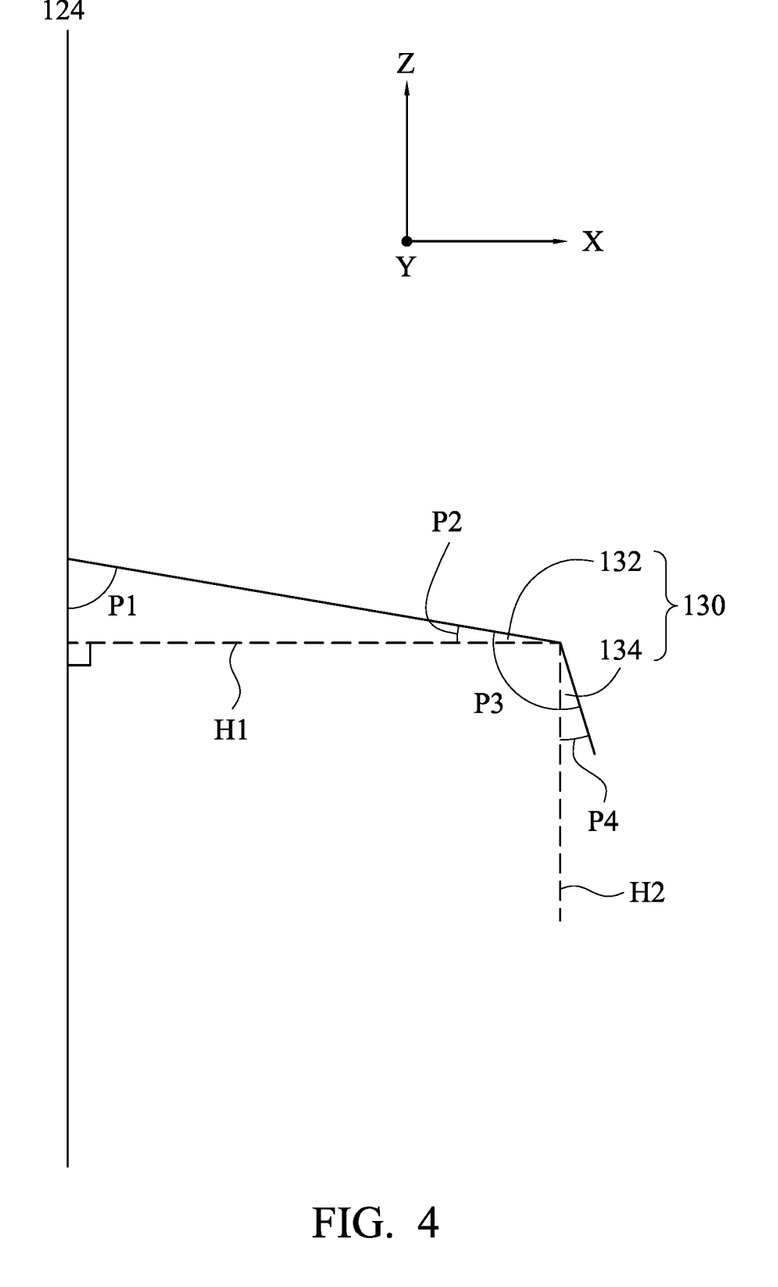
FIG. 4 is a schematic side view of the fixing member and the probe in accordance with some embodiments of the present disclosure.

The above description is directed to the structure of the arm portion 132 projected on the wafer 144 (testing pad 140), i.e. the structure viewed on the X-Y plane. The following description describes the structure of the arm portion 132 directed downwards to the testing pad 144 from a sidewall 124 of the second through opening 122 of the fixing member 120, i.e. the structure viewed on the Z-X plane. However, structures with other angles are also suitable for use in embodiments of the present disclosure, and the embodiments of the present disclosure are not limited thereto. Referring to FIG. 4, FIG. 4 is a schematic side view of the fixing member 120 and the probe 130 in accordance with some embodiments of the present disclosure. As shown in FIG. 4, the arm portion 132 is directed downwards to the sidewall 124 of the second through opening, in which an included angle P1 between the arm portion 132 and the sidewall is about 84 degrees, and an included angle P2 between the arm portion 132 and a horizontal line H1 is about 6 degrees. One end of the tip portion 134 is connected to the arm portion 132, and the other end thereof is directed downwards. An included angle P3 between the tip portion 134 and the arm portion 132 is about 104 degrees, and an included angle P4 between the tip portion 134 and a vertical line H2 is about 7 degrees.

Figure 5:
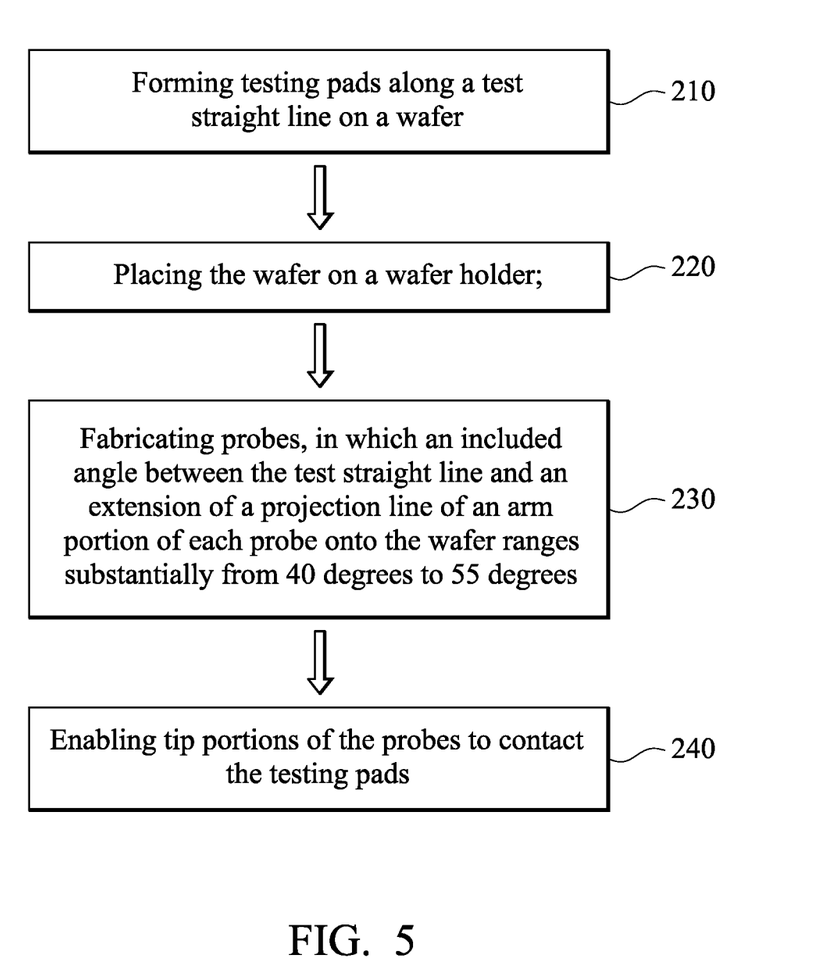
FIG. 5 is a flow chart showing a method for performing a wafer testing method in accordance with some embodiments of the present disclosure.

Hereinafter, a wafer testing method is explained according to embodiments of the present disclosure. Referring to FIG. 5, FIG. 5 is a flow chart showing a method for performing a wafer testing method in accordance with some embodiments of the present disclosure. As shown in FIG. 2A and FIG. 5, at first, plural testing pads 144 are formed along a test straight line E1 on a wafer 140 (operation 210), in which each of the testing pads 144 has a first side 147 and a second side 148 adjacent to the first side 147. Then, as shown in FIG. 1A and FIG. 5, the wafer 140 is placed on a wafer holder 150 (operation 220). As shown in FIG. 2B and FIG. 5, plural probes 130 are fabricated (operation 230), in which each probe 130 includes an arm portion 132 and a tip portion 134 connected to the arm portion 132, in which the operation 230 of fabricating the probes 130 forms an included angle C1 between the test straight line E1 and an extension of a projection line of the arm portion 132 of each probe 130 onto the wafer 140, and the included angle C1 ranges substantially from 40 degrees to 55 degrees. Thereafter, operation 240 is performed to enable the tip portions 134 of the probes 130 to contact the testing pads 144. When contacting the testing pads 144, the tip portions 134 slide from the first side 147 of each testing pad 144 towards a direction L1, in which the direction L1 has the included angle C1 with the first side 147 of each testing pad 144. In some embodiments, the operation 240 is performed under a high-speed test condition.

It can be known from the above that embodiments of the present disclosure have the following advantages. Because the included angle between the test straight line and the extension of the projection line of the arm portion of each probe onto the wafer ranges from about 40 degrees to about 55 degrees, the probe in the embodiments of the present disclosure has a larger "sliding process window"(a longer slidable distance), thereby effectively preventing the tip portion of the probe from escaping the testing pad, and lowering the possibility of bringing the electrically conductive particles to the area between two metal wires, thus promoting the success rate of the WAT, further shrinking the widths of the scribe lane and the testing pad, and increasing wafer surface availability.

In accordance with some embodiments, a wafer testing system includes a wafer holder and a probe card. A wafer is held on the wafer holder, in which testing pads are disposed on the wafer, and the testing pads are arranged along a test straight line. The probe card includes probes, and each of the probes includes an arm portion and a tip portion. An included angle is formed between the test straight line and an extension of a projection line of the arm portion onto the wafer, and the included angle ranges substantially from 40 degrees to 55 degrees. The tip portion is connected to the arm portion, and is configured to contact the wafer.

In accordance with certain embodiments, a probe card includes a circuit board, a fixing member and probes. The circuit board has a first through opening, a first surface and a second surface opposite to the first surface. The fixing member has a second through opening, in which the fixing member passes through the first through opening and is fixed on the second surface, and the second through opening has a vertical central line vertical to a direction parallel to the second surface. Each of the probes includes an arm portion and a tip portion, in which one end of the arm portion of each of the probes is fixed on the second surface, and the other end of the arm portion of each of the probes passes through a portion of the fixing member and is exposed from the second through opening. An included angle is formed between the vertical central line and an extension of the arm portion, and the included angle ranges substantially from 40 degrees to 55 degrees. The tip portion is connected to the arm portion.

In accordance with some embodiments, in a wafer testing method, testing pads are first formed along a test straight line on a wafer, in which each of the testing pads has a first side and a second side adjacent to the first side. Then, the wafer is placed on a wafer holder. Thereafter, probes are fabricated, in which each of the probes includes an arm portion and a tip portion connected to the arm portion. The operation of fabricating the probes forms an included angle between the test straight line and an extension of a projection line of the arm portion onto the wafer, and the included angle ranges substantially from 40 degrees to 55 degrees. Then, the tip portions of the probes are enabled to contact the testing pads. When contacting the testing pads, the tip portions slide from the first side of each of the testing pads towards a direction, the direction having the included angle with the first side of each of the testing pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer testing system, comprising:
   a wafer holder configured to hold a wafer thereon, wherein a plurality of testing pads are disposed on the wafer along a straight line; and
   a probe card, comprising:
      a fixing member having a second through opening defined by opposing or adjacent first and second sidewalls of the fixing member, wherein the fixing member includes a first portion inserted into a first through opening of a circuit board and a second portion fixed on a surface of the circuit board; and
      a plurality of probes arranged along the straight line and extending from the first sidewall of the fixing member, each of the probes comprising:
         an arm portion, wherein one end of the arm portion of each of the probes is fixed on the surface, and the other end of the arm portion of each of the probes passes through a portion of the fixing member and is exposed from the second through opening, and an included angle is formed between the straight line and the arm portion in a top view, and the included angle ranges substantially from 40 degrees to 55 degrees; and
         a tip portion connected to the arm portion, wherein the tip portion is configured to contact and slide on a corresponding one of the testing pads on the wafer, wherein the second sidewall of the fixing member is free of probes.

2. The wafer testing system of claim 1, wherein the second through opening has a vertical central line vertical to a direction parallel to the surface, and the vertical central line is parallel to the straight line.

3. The wafer testing system of claim 1, wherein the fixing member has a plurality of grooves extending from edges of the fixing member to the second through opening, and the arm portions of the probes are disposed in the grooves.

4. The wafer testing system of claim 3, wherein the arm portions of the probes are sealed by a sealing glue.

5. The wafer testing system of claim 1, wherein the circuit board is formed from a glass reinforced epoxy laminate, a polimid material, polycrystalline $BaTiO_3$, or an epoxy glass material.

6. The wafer testing system of claim 1, further comprising:
   a test head electrically connected to another surface of the circuit board for transmitting a test result.

7. The wafer testing system of claim 1, wherein the second through opening is rectangular or elliptic.

8. The wafer testing system of claim 1, wherein the included angle is 45 degrees, and a slidable distance of the tip portions sliding on the corresponding one of the testing pads disposed on the wafer is $\sqrt{2} \times D1$, where D1 stands for a length of a side of the corresponding one of the testing pads.

9. A probe card, comprising:
   a circuit board having a first through opening, a first surface, and a second surface opposite to the first surface;
   a fixing member having a second through opening, wherein the second through opening is defined by opposing or adjacent first and second sidewalls of the fixing member, wherein the fixing member includes a first portion inserted into the first through opening and a second portion fixed on the second surface; and
   a plurality of probes arranged along a straight line and extending from the first sidewall of the fixing member, each of the probes comprising:
      an arm portion, wherein one end of the arm portion of each of the probes is fixed on the second surface, and the other end of the arm portion of each of the probes passes through a portion of the fixing member and is exposed from the second through opening, and an included angle is formed between the straight line and the arm portion in a top view, and the included angle ranges substantially from 40 degrees to 55 degrees; and
      a tip portion connected to the arm portion wherein the second sidewall of the fixing member is free of probes.

10. The probe card of claim 9, wherein the fixing member has a plurality of grooves extending from edges of the fixing member to the second through opening, and the arm portions of the probes are disposed in the grooves.

11. The probe card of claim 9, wherein the second through opening is rectangular or elliptic.

12. The probe card of claim 9, wherein the arm portions of the probes are sealed by a sealing glue.

13. The probe card of claim 9, wherein the circuit board is formed from an glass reinforced epoxy laminate, a polimid material, polycrystalline $BaTiO_3$, or an epoxy glass material.

14. The probe card of claim 9, wherein the included angle is 45 degrees.

15. The probe card of claim 9, further comprising:
a test head electrically connected to the first surface of the circuit board for transmitting a test result.

16. A wafer testing method, comprising:
forming a plurality of testing pads on a wafer arranged along a straight line;
placing the wafer on a wafer holder;
moving a probe card toward the wafer, the probe card comprising:
a circuit board having a first through opening, a first surface, and a second surface opposite to the first surface;
a fixing member having a second through opening, wherein the second through opening is defined by opposing or adjacent first and second sidewalls of the fixing member, and the fixing member includes a first portion inserted into the first through opening and a second portion fixed on the second surface; and
a plurality of probes arranged along the straight line and extending from the first sidewall of the fixing member, and the straight line is parallel to a vertical central line of the second through opening of the fixing member, wherein the vertical central line is vertical to a direction parallel to the second surface of the circuit board, each of the probes comprising:
an arm portion, wherein one end of the arm portion of each of the probes is fixed on the second surface, and the other end of the arm portion of each of the probes passes through a portion of the fixing member and is exposed from the second through opening, and an included angle is formed between the straight line and the arm portion in a top view, and the included angle ranges substantially from 40 degrees to 55 degrees; and
a tip portion connected to the arm portion wherein the second sidewall of the fixing member is free of probes; and
enabling the probes that extend only from the first sidewall of the fixing member to contact and slide on the testing pads.

17. The wafer testing method of claim 16, wherein the testing pads are formed on one or more scribe lanes of the wafer.

18. The wafer testing method of claim 16, wherein enabling the probes to contact the testing pads is performed to perform an electrical property measurement for the wafer.

19. The wafer testing method of claim 16, wherein the included angle is 45 degrees, and a slidable distance of one of the probes sliding on a corresponding one of the testing pads is $\sqrt{2} \times D1$, where $D1$ stands for a length of a side of the corresponding one of the testing pads.

20. The wafer testing method of claim 16, wherein enabling the probes to contact the testing pads is performed under a high-speed test condition.

* * * * *